US006087069A

United States Patent [19]

Ellis

[11] Patent Number: 6,087,069
[45] Date of Patent: Jul. 11, 2000

[54] LITHOGRAPHIC IMAGING AND CLEANING OF PRINTING MEMBERS HAVING BORON CERAMIC LAYERS

[75] Inventor: Ernest W. Ellis, Harvard, Mass.

[73] Assignee: Presstek, Inc., Hudson, N.H.

[21] Appl. No.: 09/293,232

[22] Filed: Apr. 16, 1999

[51] Int. Cl.[7] .......... G03F 7/09

[52] U.S. Cl. .......... 430/273.1; 430/302

[58] Field of Search .......... 430/273.1, 271.1, 430/272.1, 302; 101/455, 467

[56] References Cited

U.S. PATENT DOCUMENTS

| | | | |
|---|---|---|---|
| 4,168,986 | 9/1979 | Venis, Jr. | 106/291 |
| 4,367,946 | 1/1983 | Varner | 355/71 |
| 4,434,010 | 2/1984 | Ash | 106/291 |
| 4,577,932 | 3/1986 | Gelbart | 350/358 |
| 4,614,408 | 9/1986 | Mir et al. | 350/388 |
| 4,743,091 | 5/1988 | Gelbart | 350/252 |
| 4,928,122 | 5/1990 | Doi et al. | 346/160 |
| 4,999,648 | 3/1991 | Debesis | 346/107 |
| 5,049,901 | 9/1991 | Gelbart | 346/108 |
| 5,059,245 | 10/1991 | Phillips et al. | 106/22 |
| 5,081,617 | 1/1992 | Gelbart | 369/112 |
| 5,132,723 | 7/1992 | Gelbart | 355/40 |
| 5,171,363 | 12/1992 | Phillips et al. | 106/22 R |
| 5,279,657 | 1/1994 | Phillips et al. | 106/22 R |
| 5,281,480 | 1/1994 | Phillips et al. | 428/412 |
| 5,383,995 | 1/1995 | Phillips et al. | 156/230 |
| 5,453,777 | 9/1995 | Pensavecchia et al. | 347/234 |
| 5,517,359 | 5/1996 | Gelbart | 359/623 |
| 5,619,245 | 4/1997 | Kessler et al. | 347/241 |
| 5,714,240 | 2/1998 | Gupta et al. | 428/209 |
| 5,744,234 | 4/1998 | Kitaori et al. | 428/332 |
| 5,745,153 | 4/1998 | Kessler et al. | 347/241 |
| 5,764,274 | 6/1998 | Sousa et al. | 347/258 |
| 5,807,658 | 9/1998 | Ellis et al. | 430/302 |
| 5,812,179 | 9/1998 | Pensavecchia et al. | 347/256 |
| 5,822,345 | 10/1998 | Sousa et al. | 372/38 |
| 6,030,751 | 2/2000 | Ellis et al. | 430/302 |

FOREIGN PATENT DOCUMENTS

| | | | |
|---|---|---|---|
| 0186508 | 12/1985 | European Pat. Off. | B41J 3/10 |
| 0412036 | 2/1991 | European Pat. Off. | G06K 15/12 |
| 4-291372 | 10/1992 | European Pat. Off. . | |
| 0517543 | 12/1992 | European Pat. Off. | B41J 2/205 |
| 0546853 | 6/1993 | European Pat. Off. | H04N 1/18 |
| 60-107975 | 6/1985 | Japan . | |
| 61-120578 | 6/1986 | Japan . | |
| 2095867 | 4/1990 | Japan | B41J 2/45 |
| 58181692 | 10/1993 | Japan | B41N 1/14 |

*Primary Examiner*—Janet Baxter
*Assistant Examiner*—Barbara Gilmore
*Attorney, Agent, or Firm*—Cesari and McKenna, LLP

[57] ABSTRACT

Lithographic printing members have inorganic protective layers that may be applied by vacuum deposition. In a representative construction, a substrate and a first layer thereover have different affinities for ink and/or a liquid to which ink will not adhere; the first layer may, for example, be applied under vacuum and comprise a metal or a metallic inorganic layer. Onto this layer is deposited a material comprising, for example, a boron ceramic, and under conditions ensuring that oxygen is present at least at the interface between the boron ceramic and the first layer. The first layer may incorporate a surface layer of oxygen or may be an oxygen compound. The oxygen facilitates hydrolysis of the boron ceramic during the print "make-ready" process.

30 Claims, 1 Drawing Sheet

LITHOGRAPHIC IMAGING AND CLEANING OF PRINTING MEMBERS HAVING BORON CERAMIC LAYERS

BACKGROUND OF THE INVENTION

1. Field of the Invention

The present invention relates primarily to digital printing apparatus and methods, and more particularly to imaging of lithographic printing-plate constructions on- or off-press using digitally controlled laser output.

2. Description of the Related Art

In offset lithography, a printable image is present on a printing member as a pattern of ink-accepting (oleophilic) and ink-rejecting (oleophobic) surface areas. Once applied to these areas, ink can be efficiently transferred to a recording medium in the imagewise pattern with substantial fidelity. Dry printing systems utilize printing members whose ink-repellent portions are sufficiently phobic to ink as to permit its direct application. Ink applied uniformly to the printing member is transferred to the recording medium only in the imagewise pattern. Typically, the printing member first makes contact with a compliant intermediate surface called a blanket cylinder which, in turn, applies the image to the paper or other recording medium. In typical sheet-fed press systems, the recording medium is pinned to an impression cylinder, which brings it into contact with the blanket cylinder.

In a wet lithographic system, the non-image areas are hydrophilic, and the necessary ink-repellency is provided by an initial application of a dampening (or "fountain") solution to the plate prior to inking. The fountain solution prevents ink from adhering to the non-image areas, but does not affect the oleophilic character of the image areas.

An alternative to traditional wet printing is single-fluid ink systems, which are emulsions of an oleophilic ink phase and an aqueous or nonaqueous polar phase. The ink is applied directly to a wet plate without prior application of dampening fluid. The polar phase wets non-image, hydrophilic portions of the plate surface, forming a weak boundary layer that prevents adsorption of the oleophilic ink component. The ink component does, however, adsorb onto the oleophilic image portions of the plate. Typically, single-fluid inks are "water-in-oil" emulsions containing up to 80% of a hydrophilic liquid such as water or a polyhydric alcohol (e.g., ethylene glycol).

Photographic platemaking processes tend to be time-consuming and require facilities and equipment adequate to support the necessary chemistry. To circumvent these shortcomings, practitioners have developed a number of electronic alternatives to plate imaging. With these systems, digitally controlled devices alter the ink-receptivity of blank plates in a pattern representative of the image to be printed. U.S. Pat. Nos. 5,339,737 and 5,783,364, the entire disclosures of which are hereby incorporated by reference, disclose a variety of lithographic plate configurations for use with imaging apparatus that operate by laser discharge. These include wet plates as described above and dry plates to which ink is applied directly. These plates may be imaged on a stand-alone platemaker or directly on-press.

In the former case, although the most cumbersome aspects of traditional platemaking are avoided, plates must be manually (and sequentially) loaded onto the platemaker, imaged, inspected, then transferred to the press and mounted to their respective plate cylinders. This involves a substantial amount of handling that can damage the plate, which is vulnerable—both before and after it is imaged—to damage from abrasion. Indeed, even fingerprints can interfere with plate performance by altering the affinity characteristics of the affected areas.

The ability to image on-press obviously reduces the possibility of handling damage substantially, but does not eliminate it. Plates must still be removed from their packaging and mounted to the press; in the case of ablation-type plates, it is frequently necessary to clean the plates to remove imaging debris, an operation that can result in abrasion if performed improperly. Indeed, lithographic printing plates can suffer damage even without handling: airborne debris, environmental contamination, movement of the packaged plates and the mere passage of time can inflict various stresses that interfere with ultimate plate performance.

To protect the plate during packaging, shipment and use, manufacturers may add a peelable barrier sheet to the final construction. As discussed, for example, in the '737 patent, this layer adheres to the surface of the plate, protecting it against damage and environmental exposure, and may be removed following imaging. But this sheet can itself damage the plate if the degree of adhesion is inappropriate or if carelessly removed, and in any case adds cost to the plate and its removal imposes an additional processing step.

U.S. Pat. No. 5,807,658 discloses wet lithographic printing plates that are provided with a protective layer serving a variety of beneficial functions, and which, desirably, washes away during the printing make-ready process. The protective layers disclosed in this patent, however, are applied by conventional coating techniques operating at atmospheric pressure. They are not amenable to application, for example, using the vacuum techniques by which the other plate layers are applied, and consequently the plates cannot be manufactured in a single pass.

DESCRIPTION OF THE INVENTION

Brief Summary of the Invention

In a first aspect, the present invention provides protective layers amenable to application by means of vacuum processes, and which are removed from the printing member during the preparatory procedures that precede printing. The protective layer guards against handling and environmental damage, and also extends plate shelf life; performs a cleaning function, entraining debris and carrying it away as the layer itself is removed; acts as a debris-management barrier if the layer immediately beneath the protective layer is ablated during the imaging process, minimizing airborne debris that might interfere with unimaged areas and/or imaging optics; and exhibits hydrophilicity, actually accelerating plate "roll-up"—that is, the number of preliminary impressions necessary to achieve proper quality of the printed image. Because the protective layer of the present invention performs these functions but disappears in the course of the normal "make-ready" process that includes roll-up—indeed, even accelerates that process—its value to the printing process is substantial.

The protective layers of the present invention are inorganic materials soluble in fountain solution (or other liquid to which ink will not adhere), e.g., boron ceramics as hereinafter defined. It is found that these compounds, particularly when applied to an underlying layer such that oxygen is present at the interface, leave the surface upon exposure to a polar fluid (e.g., hydrolyzing in response to water). Accordingly, in this aspect, the invention comprises a method of manufacturing an ablation-type printing member imageable by exposure to radiation (e.g., near infrared or "IR" radiation). A substrate and a first layer thereover have different affinities for ink and/or a liquid to which ink will not adhere; the first layer may, for example, be applied under vacuum and comprise a metal or a metallic inorganic layer. Onto this layer is deposited an inorganic material soluble in a liquid to which ink will not adhere.

In a related aspect, the invention comprises printing with members fabricated according to the foregoing process and subsequently imaged in a desired lithographic pattern.

In another aspect, the invention comprises printing members having a substrate; an ablation layer over the substrate; and an inorganic layer such as a boron ceramic over the ablation layer. The substrate and the ablation layer have different affinities for ink and/or a liquid to which ink will not adhere, and the first layer, but not the substrate, is formed of a material subject to ablative absorption of imaging radiation. As a result, a lithographic image may be formed by selective removal of the ablation layer. Furthermore; oxygen is preferably present at the interface between the boron ceramic and the ablation layer, thereby rendering the boron ceramic removable by exposure to a liquid to which ink will not adhere (e.g., fountain solution).

In another aspect, it has been found that boron ceramics also serve as excellent release layers for pigment materials formed on substrates. For example, pearlescent or interference pigment materials may be deposited—typically under vacuum— onto the surface of a polymeric release layer. The pigment material is then removed by dissolving the release layer in an organic solvent, which does not affect the pigment material, and subsequently fragmented into a particulate state.

Organic solvents pose environmental and health hazards, however, and a boron ceramic release layer facilitates use of water-based liquids to remove the pigment material. Moreover, both the boron ceramic and the pigment material may be sequentially deposited under a continuous vacuum. In accordance with this aspect of the invention, a boron ceramic is applied to a substrate (such as a polyester film). A pigment material is deposited onto the boron ceramic, and the construction (or at least the release layer) exposed to a polar liquid so as to remove at least the pigment material from the substrate.

It should be stressed that, as used herein, the term "plate" or "member" refers to any type of printing member or surface capable of recording an image defined by regions exhibiting differential affinities for ink and/or dampening fluid; suitable configurations include the traditional planar or curved lithographic plates that are mounted on the plate cylinder of a printing press, but can also include seamless cylinders (e.g., the roll surface of a plate cylinder), an endless belt, or other arrangement.

Furthermore, the term "hydrophilic" is herein used in the printing sense to connote a surface affinity for a fluid which prevents ink from adhering thereto. Such fluids include water, aqueous and non-aqueous dampening liquids, and the non-ink phase of single-fluid ink systems. Thus, a hydrophilic surface in accordance herewith exhibits preferential affinity for any of these materials relative to oil-based materials.

The term "liquid" to which ink will not adhere" connotes not only the traditional dampening solutions as described above, but also extends to polar fluids that may be incorporated within an ink composition itself. For example, so-called "waterborne" inks (or other single-fluid ink systems) contain an aqueous fraction that will remove an inorganic protective layer in accordance herewith as the plate is used for printing.

BRIEF DESCRIPTION OF THE DRAWING

The foregoing discussion will be understood more readily from the following detailed description of the invention, when taken in conjunction with the accompanying drawings, in which.

DETAILED DESCRIPTION OF THE PREFERRED EMBODIMENTS

1. Lithographic Printing Plates

Figure 1:
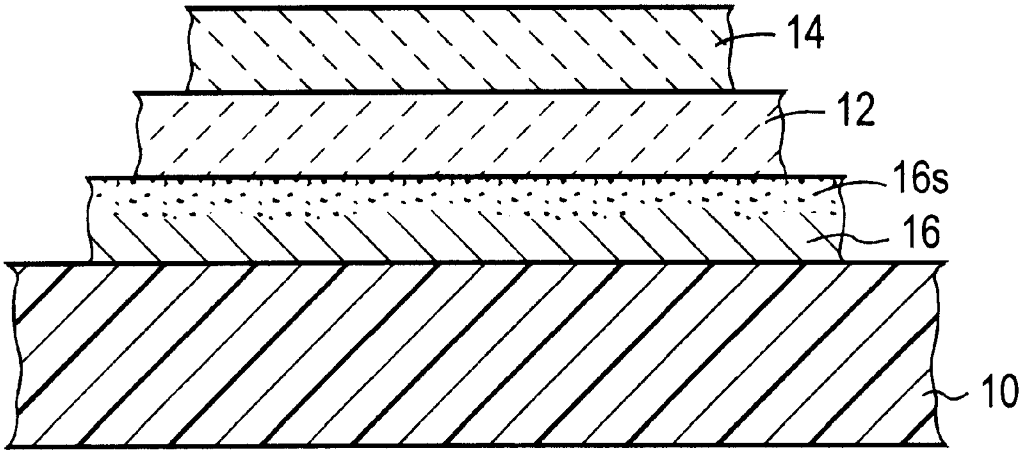
FIG. 1 is an enlarged sectional view of a lithographic plate in accordance with the present invention.

Imaging apparatus suitable for use in conjunction with the present printing members includes at least one laser device that emits in the region of maximum plate responsiveness, i.e., whose lambda$_{max}$ closely approximates the wavelength region where the plate absorbs most strongly. Specifications for lasers that emit in the near-IR region are fully described in U.S. Pat. Nos. Re. 35,512, 5,385,092, and 5,822,345 (the entire disclosures of which is hereby incorporated by reference); lasers emitting in other regions of the electromagnetic spectrum are well-known to those skilled in the art.

Suitable imaging configurations are also set forth in detail in the '512, '092, and '345 patents. Briefly, laser output can be provided directly to the plate surface via lenses or other beam-guiding components, or transmitted to the surface of a blank printing plate from a remotely sited laser using a fiber-optic cable. A controller and associated positioning hardware maintains the beam output at a precise orientation with respect to the plate surface, scans the output over the surface, and activates the laser at positions adjacent selected points or areas of the plate. The controller responds to incoming image signals corresponding to the original document or picture being copied onto the plate to produce a precise negative or positive image of that original. The image signals are stored as a bitmap data file on a computer. Such files may be generated by a raster image processor (RIP) or other suitable means. For example, a RIP can accept input data in page-description language, which defines all of the features required to be transferred onto the printing plate, or as a combination of page-description language and one or more image data files. The bitmaps are constructed to define the hue of the color as well as halftoning screen frequencies and angles.

The imaging apparatus can operate on its own, functioning solely as a platemaker, or can be incorporated directly into a lithographic printing press. In the latter case, printing may commence immediately after application of the image to a blank plate, thereby reducing press set-up time considerably. The imaging apparatus can be configured as a flatbed recorder or as a drum recorder, with the lithographic plate blank mounted to the interior or exterior cylindrical surface of the drum. Obviously, the exterior drum design is more appropriate to use in situ, on a lithographic press, in which case the print cylinder itself constitutes the drum component of the recorder or plotter.

In the drum configuration, the requisite relative motion between the laser beam and the plate is achieved by rotating the drum (and the plate mounted thereon) about its axis and moving the beam parallel to the rotation axis, thereby scanning the plate circumferentially so the image "grows" in the axial direction. Alternatively, the beam can move parallel to the drum axis and, after each pass across the plate, increment angularly so that the image on the plate "grows" circumferentially. In both cases, after a complete scan by the beam, an image corresponding (positively or negatively) to the original document or picture will have been applied to the surface of the plate.

In the flatbed configuration, the beam is drawn across either axis of the plate, and is indexed along the other axis after each pass. Of course, the requisite relative motion between the beam and the plate may be produced by movement of the plate rather than (or in addition to) movement of the beam.

Regardless of the manner in which the beam is scanned, it is generally preferable (for on-press applications) to employ a plurality of lasers and guide their outputs to a single writing array. The writing array is then indexed, after completion of each pass across or along the plate, a distance determined by the number of beams emanating from the array, and by the desired resolution (i.e., the number of image points per unit length). Off-press applications, which can be designed to accommodate very rapid plate movement (e.g., through use of high-speed motors) and thereby utilize high laser pulse rates, can frequently utilize a single laser as an imaging source.

With reference to FIG. 1, a plate construction in accordance with the present invention includes a substrate 10, a surface layer 12, and a protective layer 14. Substrate 10 is preferably strong, stable and flexible, and may be a polymer film, or a paper or thermally insulated metal sheet. Polyester films (in preferred embodiments, the MYLAR or MELINEX film sold by E.I. duPont de Nemours Co., Wilmington, Del.) furnish useful examples. A preferred polyester-film thickness is 0.007 inch, but thinner and thicker versions can be used effectively.

Paper substrates are typically "saturated" with polymerics to impart water resistance, dimensional stability and strength. Aluminum is a preferred metal substrate. Ideally, the aluminum is polished so as to reflect any imaging radiation penetrating any overlying layers. One can also employ, as an alternative to a metal reflective substrate 10, a layer containing a pigment that reflects imaging (e.g., IR) radiation. A material suitable for use as an IR-reflective substrate is the white 329 film supplied by dupont, which utilizes IR-reflective barium sulfate as the white pigment. A preferred thickness is 0.007 inch, or 0.002 inch if the construction is laminated onto a metal support as described hereinbelow.

Because hard materials deposited on softer materials (e.g., polyesters) can be vulnerable to scratching and similar surface damage, it may be helpful to apply a layer harder than substrate 10 to the surface thereof. This hard layer can be a highly crosslinked polyacrylate, and a representative thickness range for such a layer is 1–2 $\mu$m.

Surface layer 12 may comprise a metallic inorganic compound of at least one metal with at least one non-metal, or a mixture of such compounds. It is generally applied at a thickness of 100–5000 Å or greater; however, optimal thickness is determined primarily by durability concerns, and secondarily by economic considerations and convenience of application. The metal component of layer 12 may be a d-block (transition) metal, an f-block (lanthanide) metal, aluminum, indium or tin, or a mixture of any of the foregoing (an alloy or, in cases in which a more definite composition exists, an intermetallic). Preferred metals include titanium, zirconium, vanadium, niobium, tantalum, molybdenum and tungsten. The non-metal component of layer 12 may be one or more of the p-block elements boron, carbon, nitrogen, oxygen and silicon. A metal/non-metal compound in accordance herewith may or may not have a definite stoichiometry, and may in some cases (e.g., Al—Si compounds) be an alloy. Preferred metal/non-metal combinations include TiN, TiON, $TiO_x$ (where $0.9 \leqq x \leqq 2.0$), TiAlN, TiAlCN, TiC and TiCN.

This layer ablates in response to IR radiation, and an image is imposed onto the plate through patterned exposure to the output of one or more lasers. Layer 12 may exhibit hydrophilic properties, providing the basis for use of this construction as a wet lithographic printing plate. Imagewise removal, by ablation, of layer 12 (and, less importantly given its wash-away character, layer 14 as well) exposes underlying layer 10, which is oleophilic; accordingly, while layer 12 accepts fountain solution, layer 10 rejects fountain solution but accepts ink. Complete imagewise ablation of layer 12 is therefore important in order to avoid residual hydrophilicity in an image feature.

The construction can also include a metal layer 16 to promote adhesion of layer 12 to substrate 10; alternatively, layer 16 may be hydrophilic (by virtue, for example, of a native oxide surface 16*s*) and serve as a printing surface instead of layer 12, which is then omitted.

Protective layer 14 is deposited over metallic inorganic layer 12 or, if provided in lieu of layer 12, over metal layer 16. Layer 14 may be a boron ceramic (a term herein used to connote a compound of boron with a non-metal such as carbon ($B_4C$), nitrogen (BN), or combinations thereof). To facilitate hydrolysis of layer 14 before printing commences, some oxygen should be present at (at least) the interface between layer 14 and the underlying layer (i.e., layer 12 or layer 16) in order that boron-oxygen bonds may form. Oxygen may be provided by a native oxide surface (e.g., surface 16*s*), or may instead arise by deliberate control of the deposition process. For example, a TiN layer 12 may be lightly pretreated with an oxygen-argon mix in a plasma prior to deposition of the boron ceramic. Alternatively, the boron ceramic may be deposited by sputter coating in a vacuum that initially includes some oxygen, supply of which is terminated as deposition proceeds in order, once again, to confine oxide content to the interfacial region between layers 14 and 12. Excessive oxygen throughout layer 12 can compromise the effectiveness of protection, while oxide content at the exposed surface of protective layer 14 can render this layer vulnerable to unwanted fingerprinting.

Layer 14 is preferably applied at a minimal thickness consistent with its roles, i.e., providing protection against handling and environmental damage, extending plate shelf life by shielding the plate from airborne contaminants, and entraining debris produced by imaging. The thinner layer 14 can be made, the more quickly it will wash off during press make-ready, the shorter will be the roll-up time, and the less the layer will affect the imaging sensitivity of the plate. A representative thickness is 500 Å, while the useful range extends from about 100 Å to 1500 Å.

Layer 16, if provided, is a very thin (50–500 Å, with 300 Å preferred for titanium) layer of a metal that may or may not passivate upon exposure to air to develop an oxide surface 16*s*.

The metal of layer 16 is at least one d-block (transition) metal, aluminum, indium or tin. In the case of a mixture, the metals are present as an alloy or an intermetallic. Again, the development, on more active metals, of an oxide layer can create surface morphologies that improve hydrophilicity. Such oxidation can occur on both metal surfaces, and may also, therefore, affect adhesion of layer 16 to substrate 10 (or other underlying layer). Substrate 10 can also be treated in various ways to improve adhesion to layer 16. For example, plasma treatment of a film surface with a working gas that includes oxygen (e.g., an argon/oxygen mix) results in the addition of oxygen to the film surface, improving adhesion by rendering that surface reactive with the metal(s) of layer 16. Oxygen is not, however, necessary to successful plasma treatment. Other suitable working gases include pure argon, pure nitrogen, and argon/nitrogen mixtures. See, e.g., Bernier et al., *ACS Symposium Series* 440, *Metallization of Polymers,* p. 147 (1990).

Depending on their thicknesses, the various layers above substrate 10 may interact to produce visible colors. Ideally, the color of the plate including the layer 14 differs from that without layer 14, since the contrast provides a visual indication of the extent to which layer 14 has been removed during the make-ready process. This contrast may arise through interference phenomena. For example, a construction including a white polyester substrate 10, a titanium layer 16 having a thickness of about 300 Å, a titanium nitride layer 12 about 300 Å thick, and a boron carbide layer 14 about 500 Å thick exhibits a deep blue color. Although removal of the boron carbide layer reveals the gold color characteristic of the underlying titanium/titanium nitride layers, boron carbide by itself does not exhibit any pronounced color; the observed blue hue arises from interaction among the layers 12, 14, 16.

Manufacture of a plate as shown in FIG. 1 may take place in a continuous vacuum, e.g., in a series of linked vacuum deposition chambers. A roll or "web" of the polymeric material that is to serve as the substrate 10 is unwound along a path that may include plasma pretreatment and leads into a first chamber, where metal layer 16 is applied; then to a second chamber, in which layer 12 is applied; and finally into a third chamber in which layer 14 is applied. As plate material emerges from the third chamber, it is re-wound, and when the process is complete, the rolled material is removed from the multi-chamber vacuum apparatus.

In use, the plate is imaged in accordance with a document to be printed. The imaged plate is then subjected to the action of a polar fluid, which attacks the boron-oxygen bonds at the interface between layer 14 and the underlying layer, removing what remains of layer 14. The polar fluid may be fountain solution applied during print roll-up, the polar phase of a single-fluid ink, or an ink based on a polar fluid (e.g., a water-based ink).

2. Deposited Pigment Materials

Figure 2:
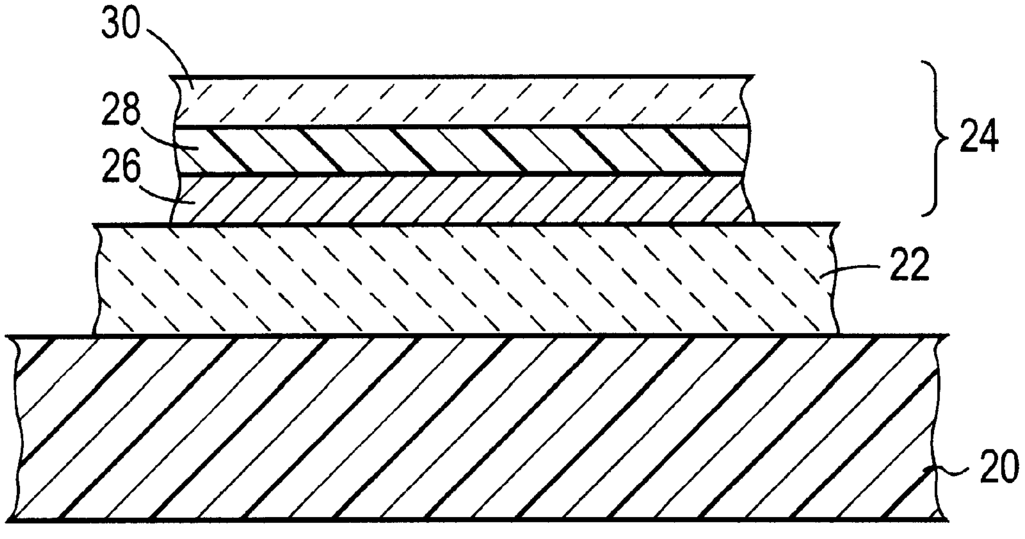
FIG. 2 is an enlarged sectional view of a construction in which a pigment material has been deposited onto a release layer comprising a boron ceramic.

With reference to FIG. 2, a pigment is formed by first depositing, onto a substrate 20, an inorganic, water-activated release layer 22. The pigment material, such as an interference stack 24, is then deposited (in successive stages for multiple layers as shown). For example, pigment material 24 may include a metal layer 26, a dielectric layer 28, and a reflective (e.g., metal or metallic inorganic) layer 30.

Layer 26 is typically a reflective layer, e.g., aluminum of thickness ranging from 50 to 500 Å. Layer 28 is a quarter-wave dielectric spacer whose thickness depends on the wavelength of interest. A thickness between 0.05 and 0.9 $\mu$m produces a visible contrast color. This layer is ordinarily polymeric, and is preferably a polyacrylate. Suitable polyacrylates include polyfunctional acrylates or mixtures of monofunctional and polyfunctional acrylate that may be applied by vapor deposition of monomers followed by electron-beam or ultraviolet (UV) cure. Layer 30 is a partially reflective layer, and may be a metal layer (as described above in connection with layer 16) or a metallic inorganic layer (as described above in connection with layer 12).

Layers 22, 26, 28, and 30 can all be deposited under vacuum conditions. In particular, layers 26 and 30 may be applied by vacuum evaporation or sputtering (e.g., with argon). Layer 28 can be applied by vapor deposition; for example, as set forth in U.S. Pat. Nos. 4,842,893 and 5,032,461 (the entire disclosures of which are hereby incorporated by reference), low-molecular-weight monomers or prepolymers can be flash vaporized in a vacuum chamber, which also contains a web of material (e.g., a suitably metallized substrate 10) to be coated. The vapor is directed at the surface of the moving web, which is maintained at a sufficiently low temperature that the monomer condenses on its surface, where it is then polymerized by exposure to actinic radiation. Ordinarily, the monomers or prepolymers have molecular weights in the range of 150–800.

The illustrated pigment material is illustrative only. Other pigments that may be rendered removable in accordance herewith are described, for example, in U.S. Pat. Nos. 5,383,995; 5,281,480; 5,279,657; 5,171,363; and 4,434,010, the entireties of which are hereby incorporated by reference.

Substrate 20 may be polyester or other suitable material with an oxygen-containing surface; oxygen can be introduced into an otherwise suitable surface by mild corona-discharge treatment. Alternatively, oxygen can be introduced into layer 22 as it is deposited. The objective, once again, is to form hydrolyzable interfacial (and, possibly, internal) boron-oxygen bonds which, in this case, facilitate release from substrate 20.

Following the successive depositions, the finished structure is exposed (e.g., by immersion) to a polar liquid, preferably water (or a water-based solvent). The polar liquid causes layer 22 to separate from substrate 20, and may cause layer 22 to dissolve as well. Pigment material 24 is then ground or otherwise used. Even if layer 22 does not dissolve, however, it can be chosen so as to be colorless, in which case its residual presence with pigment material 24 will not affect the performance of the resulting pigment.

Alternatively, if oxygen is present not only at the surface of layer 22 in contact with substrate 20 but also at the surface in contact with pigment material 24 (e.g., confined to the surfaces or distributed throughout the thickness of layer 22 including the surfaces), subjection to a polar solvent may also effect release of pigment material 24 from departing layer 22.

It will therefore be seen that the foregoing techniques provide a basis for improved lithographic printing and fabrication of pigments. The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed.

What is claimed is:

1. A method of printing comprising:

a. providing a printing member fabricated according to steps comprising:

i. providing a substrate and, thereover, a first layer, the substrate and the first layer having different affinities for a liquid selected from the group consisting of ink and a liquid to which ink will not adhere; and ii. depositing onto the first layer a boron ceramic layer removable by a liquid to which ink will not adhere;

b. selectively exposing, in a pattern representing an image, the printing member to laser output so as to ablate selected portions of at least the first layer, thereby directly producing an array of image features;

c. subjecting the printing member to a liquid to which ink will not adhere so as to remove the inorganic layer and wet unablated portions of the printing member;

d. applying ink to the member; and e. transferring the ink to a recording medium.

2. The method of claim 1 wherein oxygen being present at least at the interface between the boron ceramic and the first layer.

3. The method of claim 1 wherein the printing member exhibits a first color prior to step (c) and a second color, contrasting with the first color, following step (c).

4. A method of manufacturing a printing plate, the method comprising the steps of:

a. providing a substrate and, thereover, a first layer, the substrate and the first layer having different affinities for a liquid selected from the group consisting of ink and a liquid to which ink will not adhere; and b. depositing onto the first layer a boron ceramic layer removable by a liquid to which ink will not adhere.

5. The method of claim 4 wherein oxygen being present at least at the interface between the boron ceramic and the first layer.

6. The method of claim 5 wherein the deposition step forms hydrolyzable boron-oxygen bonds at the interface between the deposited boron ceramic and the first layer.

7. The method of claim 5 wherein the deposited boron ceramic is selected from the group consisting of boron carbide, boron nitride, and boron carbonitride.

8. The method of claim 5 wherein the first layer and the boron ceramic are applied by a deposition process under a continuous vacuum.

9. The method of claim 4 wherein the inorganic layer is deposited under vacuum.

10. The method of claim 4 wherein the first layer comprises a metallic inorganic compound of at least one metal with at least one non-metal.

11. The method of claim 10 wherein the at least one non-metal is selected from the group consisting of boron, carbon, nitrogen, silicon and oxygen.

12. The method of claim 10 wherein the compound of the first layer comprises at least one metal selected from the group consisting of (i) a d-block transition metal, (ii) an f-block lanthanide, (iii) aluminum, (iv) indium and (v) tin.

13. The method of claim 10 wherein the compound of the first layer is titanium nitride having an oxygen-containing surface.

14. The method of claim 13 wherein the printing member further comprises a titanium layer between the first layer and the substrate.

15. The method of claim 10 wherein the first layer is titanium having an oxygen-containing surface.

16. The method of claim 4 wherein the first layer is hydrophilic and the substrate is oleophilic.

17. A printing member comprising:

a. a substrate;

b. an ablation layer thereover, the substrate and the ablation layer having different affinities for a liquid selected from the group consisting of ink and a liquid to which ink will not adhere, the first layer, but not the substrate, being formed of a material subject to ablative absorption of imaging radiation; and c. a boron ceramic layer removable by a liquid to which ink will not adhere.

18. The member of claim 17 wherein oxygen being present at least at the interface between the boron ceramic and the ablation layer.

19. The member of claim 18 further comprising hydrolyzable boron-oxygen bonds at the interface between the deposited boron ceramic and the first layer.

20. The member of claim 18 wherein the deposited boron ceramic is boron carbide.

21. The member of claim 18 wherein the deposited boron ceramic is boron nitride.

22. The member of claim 18 wherein the deposited boron ceramic is boron carbonitride.

23. The member of claim 17 wherein the first layer comprises a metallic inorganic compound of at least one metal with at least one non-metal.

24. The member of claim 23 wherein the at least one non-metal is selected from the group consisting of boron, carbon, nitrogen, silicon and oxygen.

25. The member of claim 23 wherein the compound of the first layer comprises at least one metal selected from the group consisting of (i) a d-block transition metal, (ii) an f-block lanthanide, (iii) aluminum, (iv) indium and (v) tin.

26. The member of claim 23 wherein the first layer is titanium nitride having an oxygen-containing surface.

27. The member of claim 26 wherein the printing member further comprises a titanium layer between the first layer and the substrate.

28. The member of claim 23 wherein the first layer is titanium having an oxygen-containing surface.

29. The member of claim 17 wherein the first layer is hydrophilic and the substrate is oleophilic.

30. The member of claim 17 wherein the printing members exhibits a color contrasting with that exhibited by the plate in the absence of the inorganic layer.

* * * * *